US006766493B1

(12) United States Patent
Hoffman et al.

(10) Patent No.: US 6,766,493 B1
(45) Date of Patent: Jul. 20, 2004

(54) METHOD AND APPARATUS FOR GENERATING AND CHECKING CYCLIC REDUNDANCY CODE (CRC) VALUES USING A CRC GENERATOR AND BINARY GALOIS FIELD MULTIPLIER

(75) Inventors: Robert L. Hoffman, Santa Clara, CA (US); Jonathan M. Parlan, Los Altos, CA (US)

(73) Assignee: Cisco Technology, Inc., San Jose, CA (US)

( * ) Notice: Subject to any disclaimer, the term of this patent is extended or adjusted under 35 U.S.C. 154(b) by 510 days.

(21) Appl. No.: 09/748,645

(22) Filed: Dec. 21, 2000

(51) Int. Cl.$^7$ .......................... H03M 13/15; G06F 7/00; G11C 29/00

(52) U.S. Cl. ...................... 714/785; 714/752; 714/762; 714/763; 708/492

(58) Field of Search .......................... 708/492; 714/752, 714/762–763, 781–785

(56) References Cited

U.S. PATENT DOCUMENTS

| 4,162,480 | A | | 7/1979 | Berlekamp | |
|---|---|---|---|---|---|
| 4,833,678 | A | | 5/1989 | Cohen | |
| 4,856,003 | A | | 8/1989 | Weng | |
| 5,282,214 | A | | 1/1994 | Dravida | |
| 5,398,284 | A | | 3/1995 | Koopman, Jr. et al. | |
| 5,410,546 | A | * | 4/1995 | Boyer et al. | 714/763 |
| 6,581,083 | B1 | * | 6/2003 | Su et al. | 708/492 |
| 6,581,180 | B1 | * | 6/2003 | Weng | 714/781 |
| 6,609,225 | B1 | * | 8/2003 | Ng | 714/781 |
| 2003/0167440 | A1 | * | 9/2003 | Cavanna et al. | 714/781 |

FOREIGN PATENT DOCUMENTS

JP         2000-269826 A      9/2000

OTHER PUBLICATIONS

José Maria Nadal Serrano.; 5+4 Gbps 0.35 micron CMOS CRC generator designed with standard cells ELectrotechnical Conference, 2002. MELECON 2002. 11th Mediterranean, 2002 pp. 215–219.*

Peterson, W. Wesley; Weldon, E. J.; Error Correcting Codes, Second Edition; 1972; MIT Press; pp. 228–229.*

(List continued on next page.)

Primary Examiner—R. Stephen Dildine
(74) Attorney, Agent, or Firm—The Law Office of Kirk D. Williams (57) ABSTRACT

Methods and apparatus are disclosed for generating and checking CRC values using a multi-byte CRC generator and a binary Galois field ("GF2") multiplier. These methods and apparatus could be used in an unlimited number of applications and environments, such as part of computer or communications device (e.g., router or switch). The CRC generator and/or checker may be implemented singularly or in a combination of technologies, including, but not limited to, software, firmware, hardware, customized circuitry, application-specific integrated circuits, etc. A CRC generator is used to calculate a preliminary CRC value on a block of information. This CRC generator may be a balanced XOR tree or some other implementation, which calculates the preliminary CRC value on groups of n bytes of data at a time, where n is some integer greater than one. For example, when data is transferred over a 512 wide bit bus, typically the value of n would be 64 (i.e., 512 bits divided by 8 bits per byte). Because the number of bytes in the data group may not be an even multiple of the value of n, one or more bytes of value zero may be appended to the data group to make it an even multiple, with the preliminary CRC being calculated on the entire appended data group. A GF2 multiplier uses the preliminary CRC value and the number of appended bytes of value zero to calculate the actual CRC value of the information.

42 Claims, 4 Drawing Sheets

OTHER PUBLICATIONS

Runkel, Marc, Ethernet Network Questions and Answers, Summarized from Usenet group omp.dcom.lans.ethernet Version 2. Dec. 13, 1994, copy available at http://www.ethermanage.com/ethernet/enet–faqs/ethernet–faq.html pp. 1–2.*

Winn Schwartu, Wip Out Web Graffiti By Going Back To Basics, Feb. 14, 2000, Network World, p. 59.

I. S. Reed and Rein Turn, "A Generalization of Shift–Register Sequence Generators," J. of the ACM, vol. 16, No. 3, Jul. 1969, pp. 461–473.

W. Wesley Peterson and E. J. Weldon, Jr., Error–Correcting Codes, Second Edition, Masschusetts Institute of Technology, 1972, pp. 170–268.

FDDI Media Access Control (MAC–2), ANSI X3T9.5/88–139, Jul. 3, 1992, pp. 1–6.

France Mendez, "VHDL and Cyclic Corrector Codes," Proceedings of the conference on European design automation conference, Granoble, France, IEEE Computer Society Press, 1994, pp. 526–531.

David C. Feldmeier, "Fast Software Implementation of Error Detection Codes," IEEE/ACM Transactions on Networking, vol. 3, No. 6, Dec. 1995, pp. 640–651.

Anna HAC and Xiaoyang Chu, "A New Cell Loss Recovery Method Using Forward Error Correction in ATM Networks," Int. J. Network Mgmt, vol. 8, John Wiley & Sons, Ltd, 1998, pp. 87–103.

Dilip V. Sarwate, "Computation of Cyclic Redundancy Checks via Table Look–up," Communications of the ACM, vol. 31, No. 8, Aug. 1998, pp. 1008–1013.

Douglas E. Comer, Computer Networks and Internets, Second Edition, Prentice Hall, 1999, pp. 53–69.

Larry L. Peterson and Bruce S. Davie, Computer Networks: A Systems Approach, Second Edition, Morgan Kaufman Publishers, 2000, pp. 92–103 and 158–159.

* cited by examiner

METHOD AND APPARATUS FOR GENERATING AND CHECKING CYCLIC REDUNDANCY CODE (CRC) VALUES USING A CRC GENERATOR AND BINARY GALOIS FIELD MULTIPLIER

FIELD OF THE INVENTION

The invention relates to detecting errors in communication between components and/or systems; more particular, the invention relates to generating and checking cyclic redundancy code (CRC) values using a CRC generator and binary Galois field multiplier.

BACKGROUND OF THE INVENTION

Devices such as computers, routers, networking equipment, and components thereof communicate information internally and/or with other devices. For example, computers might communicate across a local area network (LAN) using Ethernet protocol, or application-specific integrated circuits (ASICs) may communicate with each other over a single or parallel bit bus. It is important for these devices to reliably communicate and to detect errors in their communication.

One common technique for detecting transmission errors is a technique known as the cyclic redundancy check (CRC). A CRC allows the detection of errors using only a small number of redundant bits typically sent along with the communicated information. For example, a 32-bit CRC gives strong protection against common bit errors in messages that are thousands of bits long. Ethernet, a common link-level protocol, uses a frame format that includes CRC-32, a specific 32-bit CRC having the polynomial of:

$$\text{CRC-32: } P(x) = x^{26} + x^{23} + x^{22} + x^{16} + x^{12} + x^{11} + x^{10} + x^8 + x^7 + x^5 + x^4 + x^2 + x + 1$$

One common method for computation of a CRC operates serially on each bit of a message using a shift register and XOR gates, where the number of bits in the shift register equals the degree of the CRC generating polynomial. The value of the CRC is determined by calculating the CRC from the first byte of the frame and stops calculating the CRC at the last byte. During transmission, this CRC is usually appended to the end of the frame. The receiver of the frame then calculates the CRC on the frame it receives, and compares the calculated CRC to the data source generated CRC that was appended to the end of the frame. If they match, the frame has a good CRC; otherwise, the frame is corrupted and is typically discarded. This serial approach for determining a CRC may be sufficient for certain applications. However, especially at higher operating rates, the serial determination of a CRC may be too slow or may limit the effective communication rate between devices or components.

One approach to increase the rate for determining a CRC is to process several bytes in parallel, such as using a balanced XOR tree. However, a balanced XOR tree suffers from the inability to adjust to a variable number of bytes on which to determine a CRC. For example, Ethernet frames are of variable length from sixty-four bytes to 1518 bytes. Thus, a high-speed-device, such as a switch, transmitting Ethernet frames needs to accommodate the calculation of a CRC on frames of varying lengths. For example, if sixty-four bytes are operated on in parallel, then there are sixty-four possibilities where the last byte can be located.

One costly approach to accommodate variable length data frames is to implement multiple, independent balanced XOR trees for each possible data length and then to select between the results. For example, determining a CRC in parallel on blocks of sixty-four bytes would require sixty-four balanced XOR trees and then selecting between the results based on the data length (e.g., the position of the last byte of data in the block of sixty-four bytes). Some deficiencies in this approach include a timing delay due to multiplexing the results, particularly as the number of bytes operated on in parallel becomes large. Additionally, implementing such a large number of XOR trees is costly (e.g., if would require a lot of gates and silicon area in an ASIC).

The number of gates and space requirements can be reduced by using ripple XOR trees of various byte widths with multiplexing to send the output of one to the input of the next appropriate XOR tree. One approach is to implement binary multiples (e.g., 1, 2, 4, 8, etc.) of input data width. However, this approach still entails significant time delays and a limited performance.

Needed is a new way of generating CRC values using a multi-byte CRC generator on a variable number of bytes.

SUMMARY OF THE INVENTION

A device determines a cyclic redundancy check (CRC) on a block of information. A preliminary CRC on the block of information plus at least one additional byte of information is first determined. Then, the CRC for the block of information is determined through a binary Galois field multiplier operation on the preliminary CRC.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DETAILED DESCRIPTION

Methods and apparatus are disclosed for generating and checking CRC values using a CRC generator and a binary Galois field ("GF2") multiplier. Although embodiments are described herein for simplicity of illustration with reference to CRC-32 and its defined polynomial, the invention is not limited to CRC-32 nor any other CRC polynomial equation. Rather, the invention is extensible to, and includes an unlimited number of CRC polynomial equations. Moreover, the methods and apparatus disclosed herein in accordance with the invention are not limited to a single computer, computing platform, operating system, router, or communications architecture, etc. Rather, the architecture and functionality taught herein are extensible to an unlimited number of systems, devices and embodiments in keeping with the scope and spirit of the invention. Embodiments described herein include various elements and limitations, with no one element or limitation contemplated as being a critical element or limitation. Each of the claims individually recite an aspect of the invention in its entirety. Moreover, some embodiments described may include, inter alia, systems, devices, methods, and computer-readable medium containing instructions. The embodiments described herein embody various aspects and configurations within the scope and spirit of the invention.

As used herein, the term "system" is used generically herein to describe any number of devices, computers, routers, networks, computer and/or communication devices or mechanisms, components or combinations thereof. The term "computer" is used generically herein to describe any number of computers, including, but not limited to personal computers, embedded processors, ASICs, chips, workstations, mainframes, etc. The term "device" is used generically herein to describe any type of mechanism, including a computer or system or component thereof. The term "process" is used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating address spaces, a routine of a library and/or standalone application, and is not limited to any particular memory partitioning technique.

Methods and apparatus are disclosed for generating and checking CRC values using a CRC generator and a binary Galois field ("GF2") multiplier. These methods and apparatus could used in an unlimited number of applications and environments, such as part of computer or communications device (e.g., router or switch). The CRC generator and/or checker may be implemented singularly or in a combination of technologies, including, but not limited to, software, firmware, hardware, customized circuitry, application-specific integrated circuits, etc.

A CRC generator is used to calculate a preliminary CRC value on a block of information. This CRC generator may simultaneously operate on a single byte or on multiple bytes. In one embodiment, the CRC generator includes a balanced XOR tree which calculates the preliminary CRC value on groups of n bytes of data at a time, where n is an integer of value greater than one. For example, when data is transferred over a 512 wide bit bus, typically the value of n would be 64 (i.e., 512 bits divided by 8 bits per byte). Because the number of bytes in the data group may not be an even multiple of the value of n, one or more bytes of value zero may be appended to the data group to make it an even multiple, with the preliminary CRC being calculated on the entire appended data group. A GF2 multiplier uses the preliminary CRC value and the number of appended bytes of value zero to calculate the actual CRC value of the block of information.

One embodiment assembles a GF2 multiplier with a full width polynomial divider XOR tree, and enforces zero values on the invalid tail data of a block of information, such as that corresponding to an Ethernet packet. The resultant CRC from the polynomial divider XOR tree is then compensated for the padded zero's at the end by multiplying in GF2 the CRC generated on the group of n bytes of data and padded zero's with compensating GF2 constants. Each possible CRC value is a unique number in a GF2 counting space. Each of these numbers is represented in incrementing fashion by the following cyclic sequence for polynomial degree D (32 for CRC-32):

$$a^0, a^1, a^2 \ldots a^{((2^D)-2)}$$

In addition, multiplication of each of these by another results in an adding of exponents:

$$a^{x} * a^{y} = a^{(x+y)}$$

When a polynomial divider is applied systematically to data which is suppressed to zero, the effect is to apply a simple multiplication of the current CRC (GF2 number) with $a^1$, or $$a^{(exp\_crc+1)} = a^1 * a^{(exp\_crc)}$$

for each bit of zero data. A byte of such zero suppressed data is expressed as:

$$a^{(exp\_crc+8)} = a^8 * a^{(exp\_crc)},$$

and N bytes can be similarly expressed in general as:

$$a^{(ply\_crc)} = a^{(exp\_crc+(8*N))} * = a^{(exp\_crc)}$$

The term $a^{(ply\_crc)}$ represents the polynomial division output CRC for data with padded zeros. Utilizing a GF2 multiplier, the effects of the padded zeros may be removed by exercising the following compensation;

$$a^{(exp\_crc)} = a^{(-(8*N))} * a^{(ply\_crc)}$$

and noting that $$a^{(-(8*N))} * a^{(8*N)} = a^0 = 1.$$

From the above, the implementation of this invention is a lookup table of GF2 constants $a^{(-(8*N))}$ selected by N and then GF2 multiplied by the polynomial division generated CRC.

Figure 1A:
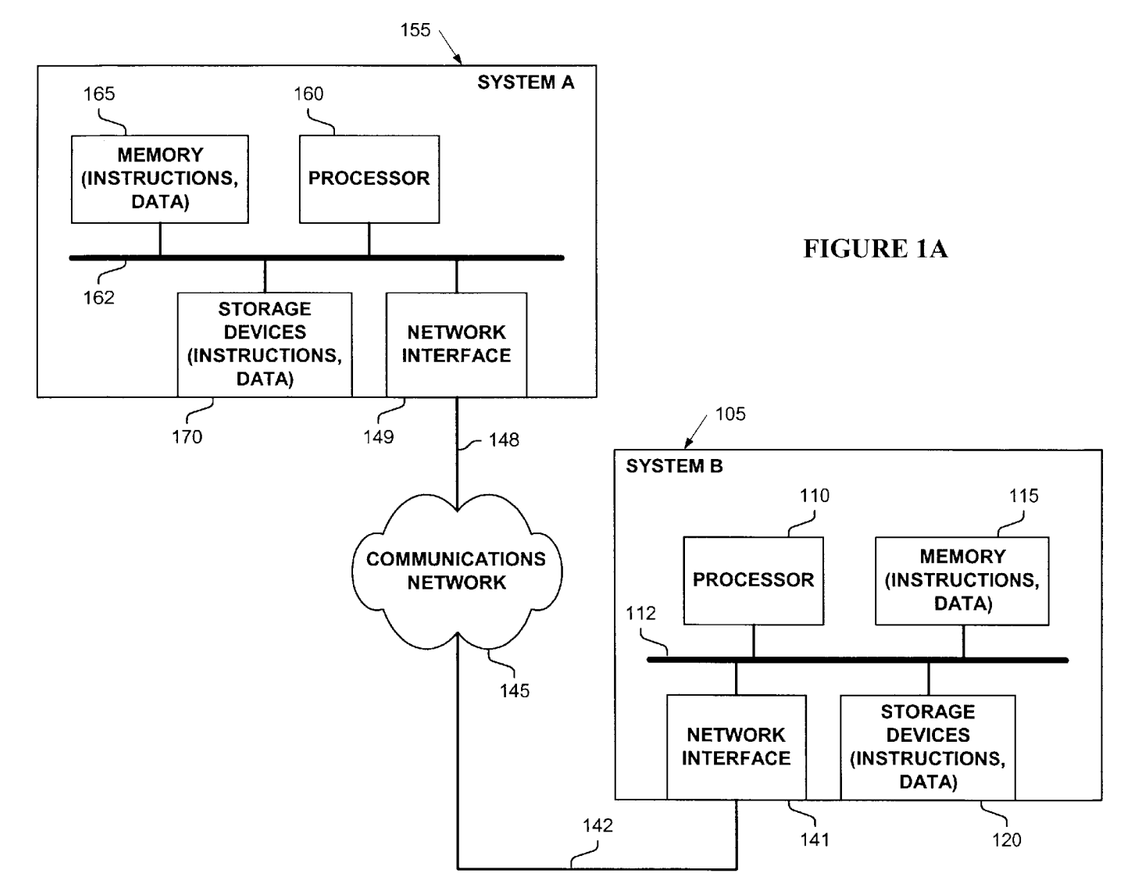
FIG. 1A is a block diagram of an exemplary embodiment and operating environment.

FIG. 1A illustrates an exemplary embodiment and operating environment of the invention. As shown, System A 155 is communicating over communications network 145 and links 142 and 148 with System B 105, wherein System A 155 and System B 105 include an embodiment of the invention for generating and/or checking CRC values using a multi-byte CRC generator and a GF2 multiplier on blocks of information typically having varying lengths. In one embodiment, System A 155 communications with System B 105 using Ethernet or some other protocol(s), and using a CRC, such as, but not limited to, CRC-8, CRC-10, CRC-12, CRC-16, CRC-CCITT, CRC-32, or some other CRC polynomial to detect errors. Various embodiments of System A 155 and/or System B 105 include, but are not limited to, an interface component (e.g., a network card) of a larger system or the larger system itself, such as a computer, switch, router or other device. System A 155 and System B 105 may be a part of the same or different devices. The CRC may be generated by processor 110 and/or 160, and/or within network interface 141 and/or 149.

In an embodiment, System B 105 comprises a processor 110, memory 115, storage devices 120, and a network interface 141, which are electrically coupled via one or more communications mechanisms 112 (shown as a bus for illustrative purposes.) Network interface 141 is connected to a communications network 145 (e.g., one or more networks, including, but not limited to the Internet, private or public telephone, cellular, wireless, satellite, cable, local area, metropolitan area and/or wide area networks, or an internal communications mechanism such as a cable, electrical connection or bus, etc.) over connection 142. Memory 115 is one type of computer-readable medium, and typically comprises random access memory (RAM), read only memory (ROM), integrated circuits, and/or other memory components. Memory 115 typically stores computer-executable instructions to be executed by processor 110 and/or data which is manipulated by processor 110 for implementing functionality in accordance with the present invention. Storage devices 120 are another type of computer-readable medium, and typically comprise disk drives, diskettes, networked services, tape drives, and other storage devices. Storage devices 120 typically store computer-executable instructions to be executed by processor 110 and/or data which is manipulated by processor 110 for implementing functionality in accordance with the present invention. System B 105 may only include some of the elements 110, 115, and 120, and/or use different elements to provided the functionality described herein.

As used herein and contemplated by the present invention, computer-readable medium is not limited to memory and storage devices; rather computer-readable medium is an extensible term including other storage and signaling mechanisms including interfaces and devices such as network interface cards and buffers therein, as well as any communications devices and signals received and transmitted, and other current and evolving technologies that a computerized system can interpret, receive, and/or transmit.

In an embodiment, System A 155 comprises a processor 160, memory 165, storage devices 170, and a network interface 149, which are electrically coupled via one or more communications mechanisms 162 (shown as a bus for illustrative purposes.) Network interface 149 is connected to a communications network 145 (e.g., one or more networks, including, but not limited to the Internet, private or public telephone, cellular, wireless, satellite, cable, local area, metropolitan area and/or wide area networks, or an internal communications mechanism such as a cable, electrical connection or bus, etc.) over connection 148. Memory 165 is one type of computer-readable medium, and typically comprises random access memory (RAM), read only memory (ROM), integrated circuits, and/or other memory components. Memory 165 typically stores computer-executable instructions to be executed by processor 160 and/or data which is manipulated by processor 160 for implementing functionality in accordance with the present invention. Storage devices 170 are another type of computer-readable medium, and typically comprise disk drives, diskettes, networked services, tape drives, and other storage devices. Storage devices 170 typically store computer-executable instructions to be executed by processor 160 and/or data which is manipulated by processor 160 for implementing functionality in accordance with the present invention. System A 155 may only include some of the elements 160, 165, and 170, and/or use different elements to provided the functionality described herein.

Additionally, System A 155, System B 105 and communications network 145 may be implemented as part of a single computer or network device, with communications network 145 being a data bus or some other internal information sharing mechanism such as message passing or shared memory.

Figure 1B:
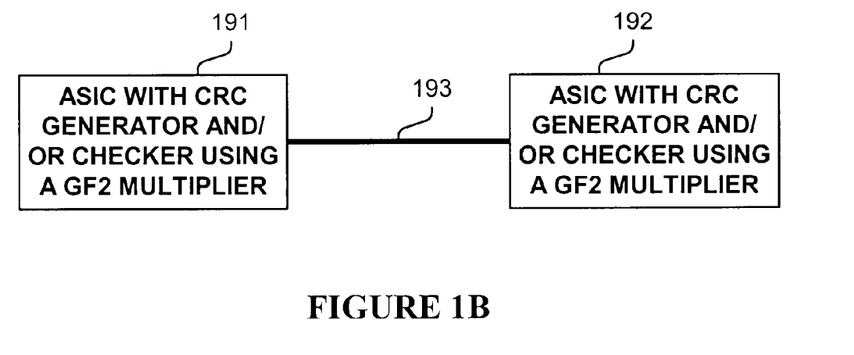
FIG. 1B is a block diagram of an embodiment of two components (e.g., ASICs) communicating over a link or bus.

FIG. 1B illustrates another embodiment where two ASICs 191 and 192 communicate over a bus 193. ASICs 191 and 192 implement the functionality of the invention using a GF2 multiplier to generate and/or check CRC values of communicated information. Various embodiments of ASICs 191 and 192 are used in, but are not limited to use in an interface component (e.g., a network card) of a larger system or the larger system itself, such as a computer, switch, router or other device. ASICs 191 and 192 may be a part of the same or different devices.

Figure 2A:
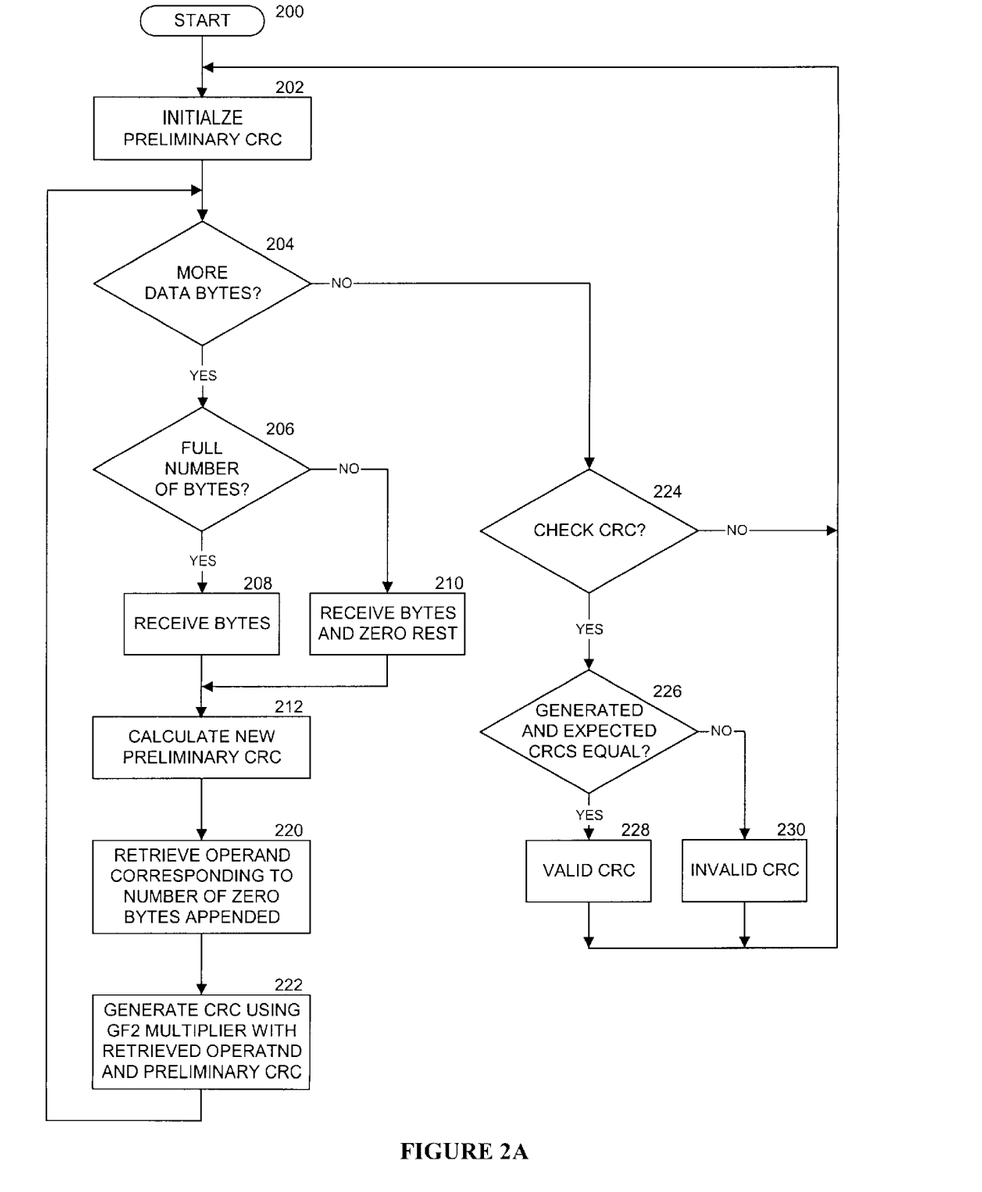
FIG. 2A is a flow diagram for determining and/or checking a CRC for a variable number of bytes of data using a binary Galois field multiplier.

FIG. 2A illustrates one embodiment for generating a CRC value on a block of information by appending bytes of value zero to pad the information block. Then using a GF2 multiplier to counter the effect of the appended bytes of value zero, the CRC for the block of information is produced.

Processing of the flow diagram of FIG. 2A begins at process block 200 and proceeds to process block 202 wherein the value of the CRC is initialized, typically to all ones. Next, while there are more bytes of the block of information to process in computing the preliminary CRC as determined in process block 204, then if there are enough bytes of information to fill the predetermined number of bytes used by the CRC generator as determined in process block 206, then the CRC will be calculated on the received bytes as indicated in process block 208. Otherwise, the CRC will be calculated on the received bytes with the remainder of the bytes set to zero as indicated by process block 210. Then in process block 212, the new preliminary CRC is calculated. In one embodiment, the predetermined number of bytes is greater than one and the CRC is generator by a multi-byte CRC generator. While in one embodiment, the predetermined number of bytes is one and the CRC is generated on a single byte of information at a time, such as by a conventional technique using a shift register.

Then, in process block 222, the actual CRC value for the information block is generated using a GF2 multiplier with an operator based on the number of zero bytes (if any) appended to the set of bytes on which the preliminary CRC was calculated. In one embodiment, when there are no bytes of value zero appended within the set of bytes on which a CRC is being calculated, the GF2 multiplier does not modify the CRC value. In one embodiment, prior to generating the CRC, an operand is retrieved from a lookup table based on the number of zero bytes appended to the information in process block 220 prior to executing process block 222. In one embodiment, step 222 and optional step 220 are performed only on a last group of bytes of the information block plus any appended bytes of value zero. Then, processing returns to block 204.

When there are no more data bytes to receive as determined in process block 204, and if the CRC is to be checked as determined in process block 224, then if the generated and expected CRCs are equal as determined in process block 226, then the generated CRC is valid as indicate by process block 228, otherwise the generated CRC is invalid as indicated by process block 230. Processing then returns to process block 202 to process more blocks of information.

Figure 2B:
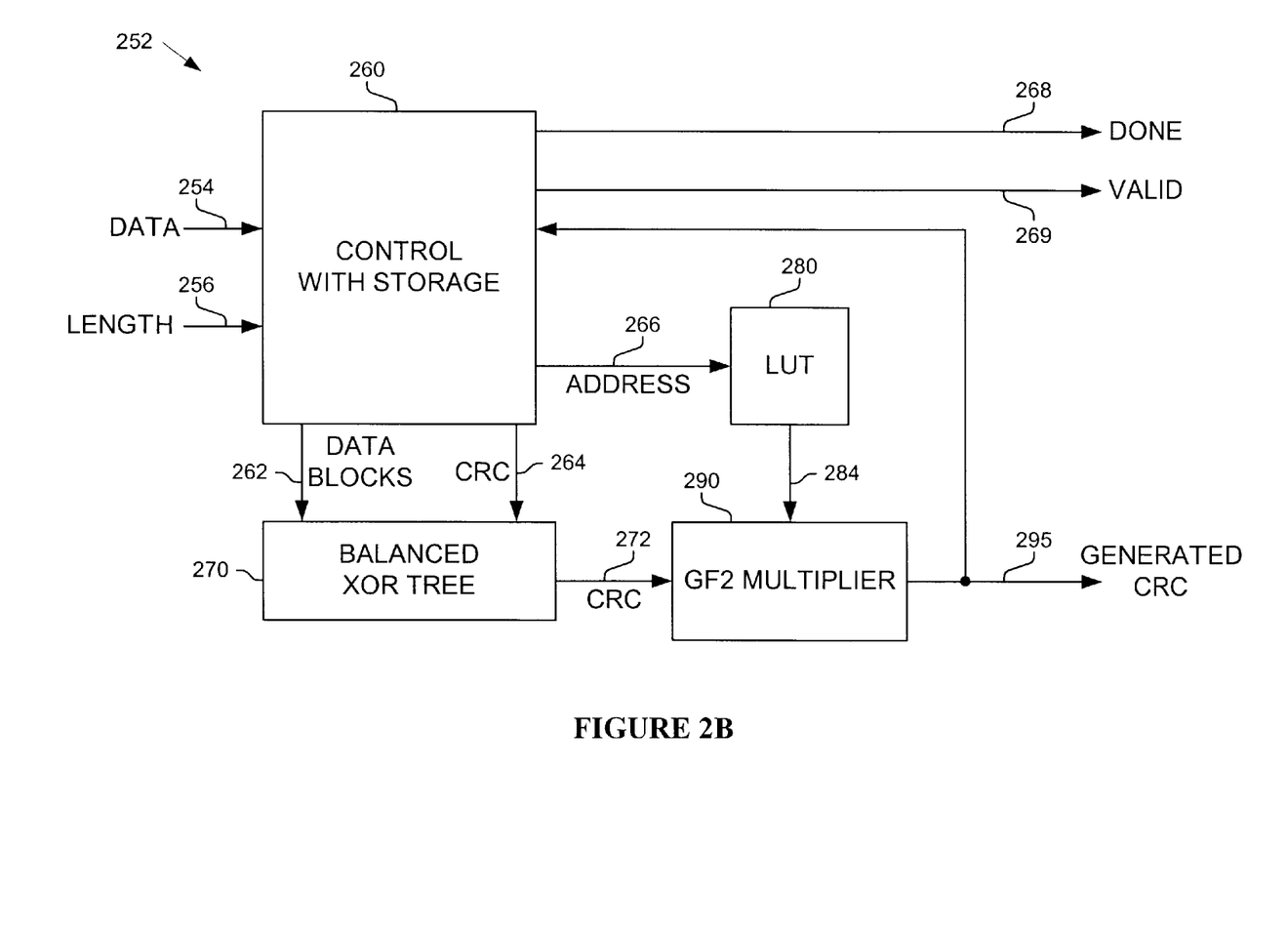
FIG. 2B is a block diagram of an embodiment including a circuit for determining and/or checking a CRC for a variable ending position of a last byte of data using a balanced XOR tree followed by a binary Galois field multiplier.

System 252 illustrated in FIG. 2B illustrates one of numerous embodiments for determining a CRC on a variable length data group using a multi-byte balanced XOR tree 270 (or some other CRC generator) and a binary Galois field ("GF2") multiplier 290. Some embodiments use the circuitry illustrated in FIG. 2B to implement the process described in relation to FIG. 2A. Balanced XOR trees and GF2 multipliers and their respective implementations are well known in the art.

In one embodiment, control with storage 260 buffers the block of information received over data link 254. In one embodiment, the length of the block of information is also received over link 256. The preliminary CRC is first initialized by control with storage 260 to typically all ones. When the preliminary CRC has been determined on the block of information plus possibly one or more appended bytes of value zero, then GF2 multiplier 290 determines the actual CRC for the block of information. This generated CRC is then made available to other components or systems over link 295.

To accomplish this, control with storage 260 communicates portions of the received block of information in n byte segments over data bus 262 and a current value of the preliminary CRC over data link 264 to balanced XOR tree 270 to determine the new preliminary CRC. If the segment is complete (all n bytes are present), control with storage 260 specifies an address 266 to lookup table (LUT) 280 to generate an operand over 284 to GF2 multiplier 290 such that the output of GF2 multiplier 290 is the same as its input. If the segment is not complete (less than n bytes are present), control with storage 260 transfers the bytes over data bus 262 with the data lines not containing bytes of information set to zero. In this case, the number of these appended zero bytes of information is used to generate an address 266 which is relayed to LUT 280, which retrieves and supplies to GF2 multiplier 290 the appropriate operand. Control with storage 260 receives the determined intermediate preliminary CRC over link 295, and then repeats this process for the next set of bytes of the received block of information.

After the last segment of the received block of data has been processed as described above, the generated CRC is made available to external components over link 295. Control with storage 260 (or some external component not shown) may check to see if the generated CRC has the same value as the expected CRC. This expected value might have been included in the received block of information or have some other predetermined constant value.

In one embodiment, control with storage 260 indicates a signal over link 268 when the value of link 295 indicates the generated CRC. In one embodiment, control with storage 260 indicates a signal over link 269 when the value of the generated CRC equals the anticipated CRC. This expected CRC may be a field extracted from the block of information or some other predetermined constant.

For simplicity of understanding, some embodiments have been described herein using one type of data structures and/or elements. As is apparent to one skilled in the art, numerous other embodiments are possible which use one or more of a wide variety of data structures and elements in keeping with the scope and spirit of the invention.

In view of the many possible embodiments to which the principles of our invention may be applied, it will be appreciated that the embodiments and aspects thereof described herein with respect to the drawings/figures are only illustrative and should not be taken as limiting the scope of the invention. To the contrary, the invention as described herein contemplates all such embodiments as may come within the scope of the following claims and equivalents thereof.

What is claimed is:

1. A method for determining a cyclic redundancy check (CRC) on a block of information, the method comprising:
   determining a preliminary CRC on the block of information plus at least one additional byte of information; and
   performing a binary Galois field ("GF2") multiplier operation on the preliminary CRC to identify the CRC for the block of information.

2. The method of claim 1, wherein the GF2 multiplier operation on the preliminary CRC includes selecting an operand based at least in part on the number of bytes in said at least one additional byte of information.

3. The method of claim 2, wherein the operand is selected from a plurality of operands maintained in a lookup table.

4. The method of claim 1, wherein said performing the GF2 multiplier operation on the preliminary CRC includes selecting an operand to generate the CRC equivalent to the preliminary CRC.

5. The method of claim 1, wherein the block of information includes a plurality of bytes; and wherein said determining the preliminary CRC includes simultaneously operating on the plurality of bytes.

6. The method of claim 5, wherein said simultaneously operating the plurality of bytes includes an operation of a balanced XOR tree.

7. The method of claim 5, wherein said determining the preliminary CRC includes operating on a single byte of block of information at a given time.

8. The method of claim 7, wherein said operating on the single byte of block of information at the given time includes an operation of a shift register.

9. The method of claim 1, comprising receiving the block of information.

10. The method of claim 1, wherein the preliminary CRC and the CRC are both CRC-32 cyclic redundancy codes.

11. The method of claim 1, wherein the block of information includes a packet of information.

12. The method of claim 11, wherein the packet of information includes fields of an Ethernet packet.

13. The method of claim 1, wherein the block of information includes a plurality of sets of bytes and a non-full set of bytes, and wherein said determining the preliminary CRC on the block of information plus at least one additional byte of information includes:
   initializing the preliminary CRC;
   determining the preliminary CRC on the plurality of sets of bytes; and
   determining the preliminary CRC on the non-full set of bytes plus said at least one additional byte of information.

14. The method of claim 13, wherein said determining the preliminary CRC on the plurality of sets of bytes includes selecting an operand to generate the CRC equivalent to the preliminary CRC by a second GF2 multiplier operation.

15. The method of claim 13, wherein each of said at least one additional byte of information has a value of zero.

16. The method of claim 15, wherein said performing the GF2 multiplier operation on the preliminary CRC includes selecting circuitry or a set of equations based on the number of bytes in said at least one additional byte of information.

17. The method of claim 1, comprising comparing the determined CRC with an expected CRC value.

18. The method of claim 17, further comprising generating a signal indicating a valid CRC if the determined CRC equals the expected CRC value.

19. The method of claim 17, further comprising generating a signal indicating an invalid CRC if the determined CRC does not equal the expected CRC value.

20. The method of claim 1, wherein said at least one additional byte of information includes at least one byte having a value of zero.

21. The method of claim 1, wherein each of said at least one additional byte of information has a value of zero.

22. An apparatus for determining a cyclic redundancy check (CRC) on a block of information, the apparatus comprising:
   a preliminary CRC generator configured to generate a preliminary CRC based on the block of information; and a binary Galois field ("GF2") multiplier, coupled to the preliminary CRC generator, configured to generate the CRC on the block of information based on the preliminary CRC.

23. The apparatus of claim 22, further including a byte clearing mechanism for setting to zero a portion of a set of bytes operated on by the preliminary CRC generator.

24. The apparatus of claim 22, including a selection mechanism for selecting circuitry based on a number of bytes set or not set to zero of the bytes operated on by the preliminary CRC generator.

25. The apparatus of claim 22, including a selection mechanism for selecting a set of operations based on a number of bytes set or not set to zero of the bytes operated on by the preliminary CRC generator.

26. The apparatus of claim 22, wherein the preliminary CRC generator includes a balanced XOR tree.

27. An apparatus for determining a cyclic redundancy check (CRC) on a block of information, the apparatus comprising:
means for determining a preliminary CRC value on the block of information combined with at least one additional byte of information; and
means for determining the CRC from the preliminary CRC value using a binary Galois field ("GF2") multiplier.

28. The apparatus of claim 27, wherein the means for determining the CRC from the preliminary CRC value using the GF2 multiplier includes means for selecting circuitry or a set of operations based on the number of bytes in said at least one additional byte of information.

29. A computer-readable medium containing computer-executable instructions for performing steps for determining a cyclic redundancy check (CRC) on a block of information, said steps comprising:
determining a preliminary CRC on the block of information plus at least one additional byte of information; and
performing a binary Galois field ("GF2") multiplier operation on the preliminary CRC to identify the CRC for the block of information.

30. The computer-readable medium of claim 29, wherein the GF2 multiplier operation on the preliminary CRC includes selecting an operand based at least in part on the number of bytes in said at least one additional byte of information.

31. The computer-readable medium of claims 30, wherein the operand is selected from a plurality of operands maintained in a lookup table.

32. The computer-readable medium of claim 29, wherein said performing the GF2 multiplier operation on the preliminary CRC includes selecting an operand to generate the CRC equivalent to the preliminary CRC.

33. The computer-readable medium of claim 29, wherein the block of information includes a plurality of bytes; and wherein said determining the preliminary CRC includes simultaneously operating on the plurality of bytes.

34. The computer-readable medium of claim 33, wherein said simultaneously operating the plurality of bytes includes an operation of a balanced XOR tree.

35. The computer-readable medium of claim 33, wherein said determining the preliminary CRC includes operating on a single byte of block of information at a given time.

36. The computer-readable medium of claim 35, wherein said operating on the single byte of block of information at the given time includes an operation of a shift register.

37. The computer-readable medium of claim 29, wherein the block of information includes a plurality of sets of bytes and a non-full set of bytes, and wherein said determining the preliminary CRC on the block of information plus at least one additional byte of information includes:
initializing the preliminary CRC;
determining the preliminary CRC on the plurality of sets of bytes; and
determining the preliminary CRC on the non-full set of bytes plus said at least one additional byte of information.

38. The computer-readable medium of claim 37, wherein said determining the preliminary CRC on the plurality of sets of bytes includes selecting an operand to generate the CRC equivalent to the preliminary CRC by a second GF2 multiplier operation.

39. The computer-readable medium of claim 37, wherein each of said at least one additional byte of information has a value of zero.

40. The computer-readable medium of claim 39, wherein said performing the GF2 multiplier operation on the preliminary CRC includes selecting circuitry or a set of equations based on the number of bytes in said at least one additional byte of information.

41. The computer-readable medium of claim 29, wherein said at least one additional byte of information includes at least one byte having a value of zero.

42. The computer-readable medium of claim 29, wherein each of said at least one additional byte of information has a value of zero.

\* \* \* \* \*

UNITED STATES PATENT AND TRADEMARK OFFICE
CERTIFICATE OF CORRECTION

PATENT NO. : 6,766,493 B1  
DATED : July 20, 2004  
INVENTOR(S) : Hoffman et al.

Page 1 of 1

It is certified that error appears in the above-identified patent and that said Letters Patent is hereby corrected as shown below:

Title page,  
Item [56], References Cited, OTHER PUBLICATIONS,  
"Proceedings of the conference on European design automation conference" reference, replace "Granoble" with -- Grenoble -- and  
"Anna Hac and Xiaoyang Chu" reference, replace "HAC" with -- Hac --

Column 1,  
Line 61, replace "high-speed-device" with -- high-speed device --

Column 4,  
Line 23, replace "$a^{(ply\_crc)} = a^{(exp\_crc + 8*N))} * = a^{(exp\_crc)}$" with -- $a^{(ply\_crc)} = a^{(exp\_crc + (8*N))} = a^{(8*N)} * a^{(exp\_crc)}$ --

Column 9,  
Line 10, replace "by the," with -- by the --  
Line 48, replace "claims" with -- claim --

Signed and Sealed this

Ninth Day of August, 2005

JON W. DUDAS  
*Director of the United States Patent and Trademark Office*